(12) United States Patent
Bergman et al.

(10) Patent No.: US 7,518,165 B2
(45) Date of Patent: Apr. 14, 2009

(54) EPITAXIAL NUCLEATION AND BUFFER SEQUENCE FOR VIA-COMPATIBLE INAS/ALGASB HEMTS

(75) Inventors: Joshua I. Bergman, Thousand Oaks, CA (US); Berinder Brar, Newbury Park, CA (US); Amal Ikhlassi, Thousand Oaks, CA (US); Gabor Nagy, Thousand Oaks, CA (US); Gerard J. Sullivan, Newbury Park, CA (US)

(73) Assignee: Teledyne Licensing, LLC, Thousand Oaks, CA (US)

( * ) Notice: Subject to any disclaimer, the term of this patent is extended or adjusted under 35 U.S.C. 154(b) by 0 days.

(21) Appl. No.: 11/521,012

(22) Filed: Sep. 14, 2006

(65) Prior Publication Data

US 2008/0067547 A1 Mar. 20, 2008

(51) Int. Cl.
*H01L 29/06* (2006.01)
(52) U.S. Cl. .............................. 257/190; 257/E29.246; 257/E29.252; 257/E21.403; 257/E21.407; 257/E21.371; 257/E21.387
(58) Field of Classification Search .......... 257/E29.246, 257/E29.252, E21.403, E21.407, 190, E21.371, 257/E21.387
See application file for complete search history.

(56) References Cited

U.S. PATENT DOCUMENTS

| | | | | |
|---|---|---|---|---|
| 5,412,224 A | * | 5/1995 | Goronkin et al. | 257/15 |
| 5,430,310 A | * | 7/1995 | Shibasaki et al. | 257/190 |
| 2006/0035467 A1 | * | 2/2006 | Nam et al. | 438/706 |
| 2006/0215718 A1 | * | 9/2006 | Yasuda et al. | 372/45.012 |

* cited by examiner

*Primary Examiner*—Jerome Jackson, Jr.
*Assistant Examiner*—Jay C Kim
(74) *Attorney, Agent, or Firm*—Snell & Wilmer L.L.P.

(57) ABSTRACT

A metamorphic high electron mobility transistor having a plurality of high electron mobility transistor layers, a semi-insulating substrate, a ternary metamorphic buffer layer positioned between the semi-insulating substrate and the plurality of high electron mobility transistor layers, the ternary metamorphic buffer layer being $Al_{1-x}Ga_xSb$ such that x is greater than or equal to 0.2 but less than 0.3, a stabilizing layer positioned between the ternary metamorphic buffer layer and the plurality of high electron mobility transistor layers, the stabilizing layer being $Al_{1-y}Ga_ySb$ such that y is greater than 0.2 but less than or equal to 0.3 and y is greater than x, and a nucleation layer interposed between the semi-insulating substrate and the ternary metamorphic buffer layer.

12 Claims, 4 Drawing Sheets

EPITAXIAL NUCLEATION AND BUFFER SEQUENCE FOR VIA-COMPATIBLE INAS/ALGASB HEMTS

BACKGROUND OF THE INVENTION

1. Field of the Invention.

The invention relates generally to High Electron Mobility Transistors ("HEMTs"). More particularly, the invention relates to epitaxial nucleation and buffer sequence for via-compatible InAs/AlGaSb HEMTs.

2. Description of Related Art

When electrons from ionized donors are placed in a material with higher conduction band energy than the channel, and close to the channel, they create an electron gas with high electron mobility. Transistors that implement this concept are known in the art as High Electron Mobility Transistors ("HEMT").

A HEMT is a field effect transistor with a junction between two materials of different band gaps, the barrier material and the channel material. The barrier material contains donor electrons with higher conduction band energy than the channel material. This improves the electron mobility by separating the donor ions from the conducting channel. The channel material makes up the conducting layer and is selected based on the transport properties of the electrons, with the band gap also being a consideration to support high fields and high voltages. Conventionally, a HEMT system is made from Galium Arsenide (GaAs) with Aluminum Galium Arsenide (AlGaAs). The donor-containing wide bandgap material is AlGaAs and the conducting channel is GaAs. The effect of the junction between these two materials is to create a very thin layer where the Fermi energy is above the conduction band, giving the channel very low resistance and high electron mobility.

HEMTs can be used for Monolithic Microwave Integrated Circuits (MMICs). In most cases, MMICs require a semi-insulating substrate to allow the use of microstrip transmission lines and high-Q passive elements such as integrated inductors. MMICs also require a semi-insulating substrate to reduce the substrate loss at high frequencies.

Ordinarily, the substrate material and the HEMT materials have the same lattice constant. If the two materials have a different lattice constant, a buffer layer can be placed between them to form a metamorphic HEMT ("mHEMT"). Since InAs-channel HEMT circuits have no lattice-matched substrate that is semi-insulating, all practical InAs-based HEMTs have been grown via metamorphic growth on a semi-insulating substrate with a different lattice constant, usually GaAs.

Prior art metamorphic buffers have had thick layers (>1 micrometer) of Aluminum Antimonide (AlSb) or Gallium Antimonide (GaSb). Since a GaSb buffer is too conductive for RF circuits, prior art InAs/AlGaSb HEMTs have typically been grown using an AlSb metamorphic buffer layer. The use of pure AlSb for the majority of the metamorphic buffer presents a problem in integrated circuit fabrication because pure AlSb is very unstable and is prone to oxidation and subsequent cracking of the epitaxial material after AlSb has been exposed to chemicals, such as acid, base, cleaning solvents, water, and even air after several hours of exposure. FIG. 1 is a cross-sectional photo obtained using a secondary electron microscope (SEM) and illustrates the oxidation of the AlSb buffer.

There are several integral steps in MMIC production that expose the AlSb metamorphic buffer to chemicals, including the etching of vias connecting the front and back sides of the wafer and the cleaving of the wafer into individual chips which expose the AlSb at the sidewalls. With an increasing demand for improved MMICs, there remains a continuing need in the art for an epitaxial nucleation and buffer layer sequence that is stable when exposed to chemicals.

SUMMARY OF THE INVENTION

A metamorphic high electron mobility transistor with reduced threading dislocations and improved chemical stability having a plurality of high electron mobility transistor layers, a semi-insulating substrate, a first ternary metamorphic buffer, and a first nucleation layer. The nucleation layer is between the semi-insulating substrate and the first ternary metamorphic buffer, and the first ternary metamorphic buffer is between the first nucleation layer and the high electron mobility transistor layers.

In one embodiment, the metamorphic high electron mobility transistor has a stabilizing layer between the first ternary metamorphic buffer and the high electron mobility transistor layers. The ternary metamorphic buffer is $Al_{0.8}Ga_{0.2}Sb$ and the stabilizing layer is $Al_{0.7}Ga_{0.3}Sb$. In another embodiment, the ternary metamorphic buffer and stabilizing layers are each composed of $Al_{1-x}Ga_xSb$, where x is greater than or equal to 0.2 but less than or equal to 0.3.

In yet another embodiment, the metamorphic high electron mobility transistor has a second nucleation layer between the first nucleation layer and the first ternary metamorphic buffer, and a third nucleation layer between the second nucleation layer and the ternary metamorphic buffer. The first nucleation layer is GaAs, the second nucleation layer is AlAs, and the third nucleation layer is AlSb.

BRIEF DESCRIPTION OF THE DRAWINGS

The exact nature of this invention, as well as the objects and advantages thereof, will become readily apparent from consideration of the following specification in conjunction with the accompanying drawings in which like reference numerals designate like parts throughout the figures thereof and wherein.

DETAILED DESCRIPTION OF THE PREFERRED EMBODIMENTS

Figure 1:
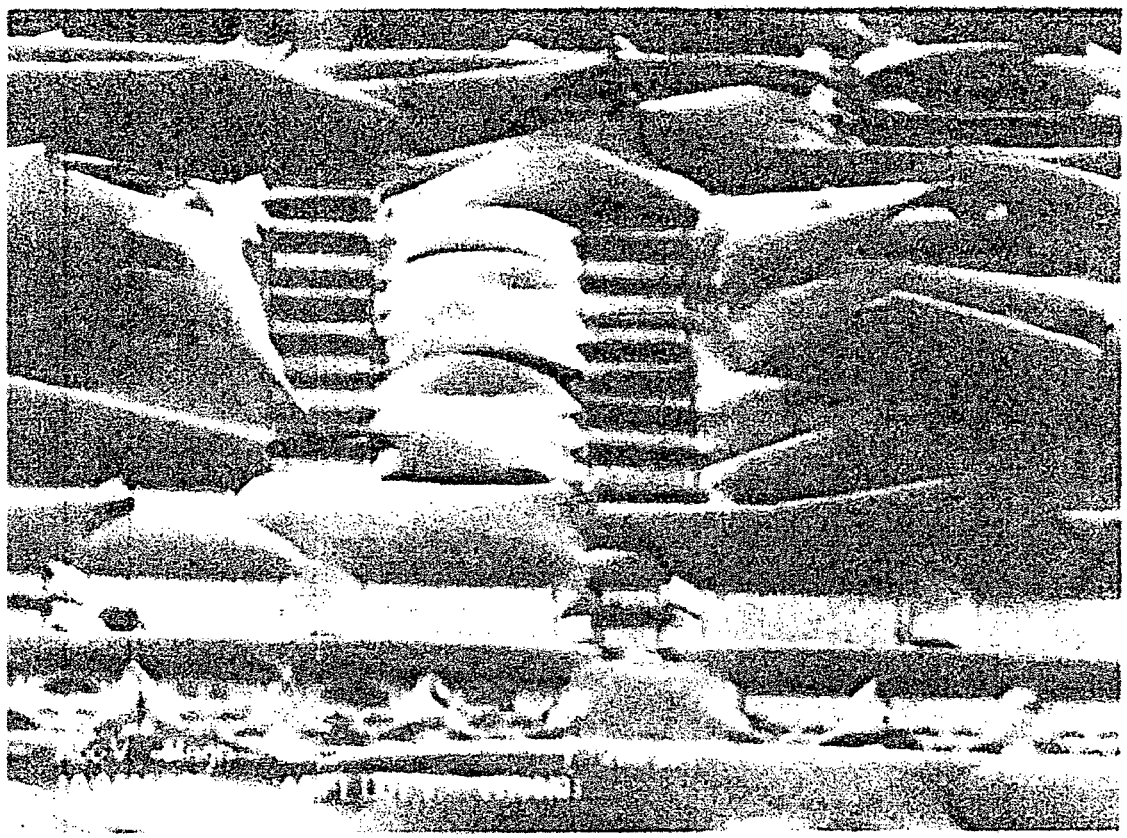
FIG. 1 is a cross-sectional photo obtained using a secondary electron microscope (SEM) and illustrates the oxidation of an AlSb buffer.
Figure 2:
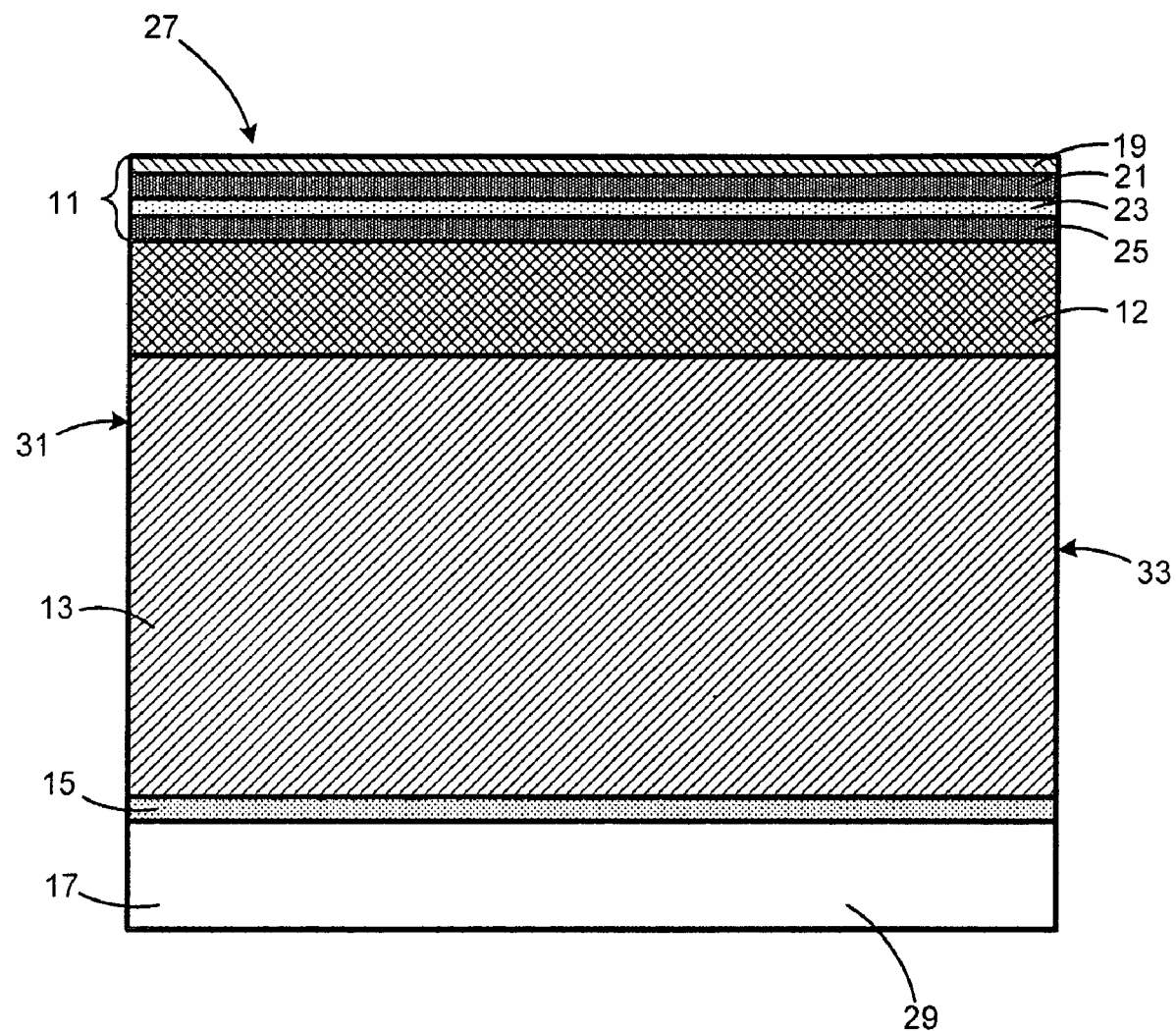
FIG. 2 is a cross-sectional view of a metamorphic HEMT, according to one embodiment of the invention.

FIG. 2 is a cross-sectional view of a metamorphic HEMT ("mHEMT"), according to one embodiment of the invention. The mHEMT has a plurality of HEMT layers 11, a stabilizing layer 12, a metamorphic buffer layer 13, a nucleation layer 15, and a substrate wafer 17. The HEMT layers 11 include a metal layer 19, a first layer of barrier material 21, a layer of channel material 23, and a second layer of barrier material 25.

The metal layer 19 can be selectively deposited or removed to form a source (not shown), a drain (not shown) and a gate (not shown). The metal layer can have a thickness of about 0.1 to about 1 µm.

The barrier material 21 and 25 can be an Antimonide-based semiconductor, such as Aluminum Antimonide (AlSb), Gallium Antimonide (GaSb), or their respective alloys. AlSb barrier 21 and 25 has about 1.3 eV conduction band offset allowing for sheet carrier concentrations up to $1\times10^{13}$ cm$^{-2}$. Both AlSb and AlGaSb are stable compounds with insulating properties, and therefore, can be used to isolate the conductive channel material 23. The barrier layers 21 and 25 can have a thickness of about 150 Å.

The channel material 23 can be an Indium-based semiconductor, such as Indium Galium Arsenide (InGaAs), Indium Arsenide (InAs), or their respective alloys. InGaAs channels have electron mobilities of about 10-15,000 cm$^2$/Vs for the highest indium concentrations. The binary InAs channel offers the highest room temperature mobility with values of about 30,000 cm$^2$/Vs possible for $1\times10^{-12}$ cm$^{-2}$ electron sheet concentrations. The channel layer 23 can have a thickness of about 150 Å.

The metamorphic buffer layer 13 is used to buffer or separate two materials of different lattice constants. The composition of the buffer layer 13 depends on the composition of the substrate 17 and/or the barrier layer 25. For example, if the substrate 17 is GaAs and the barrier layer 25 is AlSb, then the buffer 13 can have a compound with an atomic spacing that allows a smooth transition between the two materials. In this instance, since GaAs and AlSb have about the same atomic spacing, an AlSb metamorphic buffer 13 can be used. Another example, if the substrate 17 is Indium Phosphide (InP) and the barrier layer 25 is GaSb, then the metamorphic buffer 13 can be Indium Aluminum Arsenide (In$_{50\%}$A$_{50\%}$As). The metamorphic buffer layer 13 can have a thickness of about 1-2 µm.

The substrate wafer 17 can be a semi-insulating substrate, such as GaAs, InP, GaSb, or their respective alloys. The substrate wafer 17 can be about 2 to 6 inches in diameter, but preferably, about 3 to 4 inches in diameter. The substrate wafer 17 can also have a thickness ranging from 250 to 625 µm.

If the lattice constant of the substrate 17 is different from the lattice constant of the metamorphic buffer layer 13, threading dislocations in the metamorphic buffer layer 13 may occur. The number of defects is typically about $10^8$ cm$^{-2}$. These defects affect the proper functioning of the mHEMT device.

Pure AlSb metamorphic buffer 13 presents a problem in integrated circuit fabrication because pure AlSb is very unstable and is prone to oxidation and subsequent cracking of the epitaxial material after AlSb has been exposed to chemicals, such as acids, base, cleaning solvents, and water. AlSb metamorphic buffer 13 can be exposed to chemicals by the etching of vias (not shown) connecting the front 27 and back 29 sides of the wafer, and by the cleaving of the wafer into individual chips which expose the AlSb at the sidewalls 31 and 33.

To reduce threading dislocations and improve chemical stability, a metamorphic nucleation and buffer layer sequence is proposed herein. According to one embodiment of the invention, the ternary metamorphic buffer 13, such as Aluminum Gallium Antimonide (AlGaSb), can be used instead of or with the pure binary compound, AlSb.

Depending on the composition levels of the ternary AlGaSb buffer 13, the chemical stability and electrical conductivity of the buffer 13 may vary. If the gallium composition is too low, the chemical stability of the alloy will not be sufficient, but if the gallium composition is too high, the resistivity of the metamorphic buffer layer decreases, which increases the high frequency loss of the overlying circuit components. The gallium composition can range from about 5% to about 75% of the alloy by cation atomic fractional composition. However, the optimal alloy composition is preferably between about 20% to about 30% gallium.

In one embodiment, the composition of aluminum in the ternary metamorphic buffer 13 depends on the relation $Al_{1-x}Ga_xSb$. Hence, if the optimal gallium composition is between about 20% to about 30%, then the optimal aluminum composition is between about 70% to about 80%.

In one embodiment, a nucleation layer 15 is grown on the substrate 17 to transition the crystal lattice constant between the substrate 17 and the ternary metamorphic buffer 13. In another embodiment, a plurality of nucleation layers 15 are used to transition the crystal lattice constant between the substrate 17 and the ternary metamorphic buffer 13.

Figure 3:
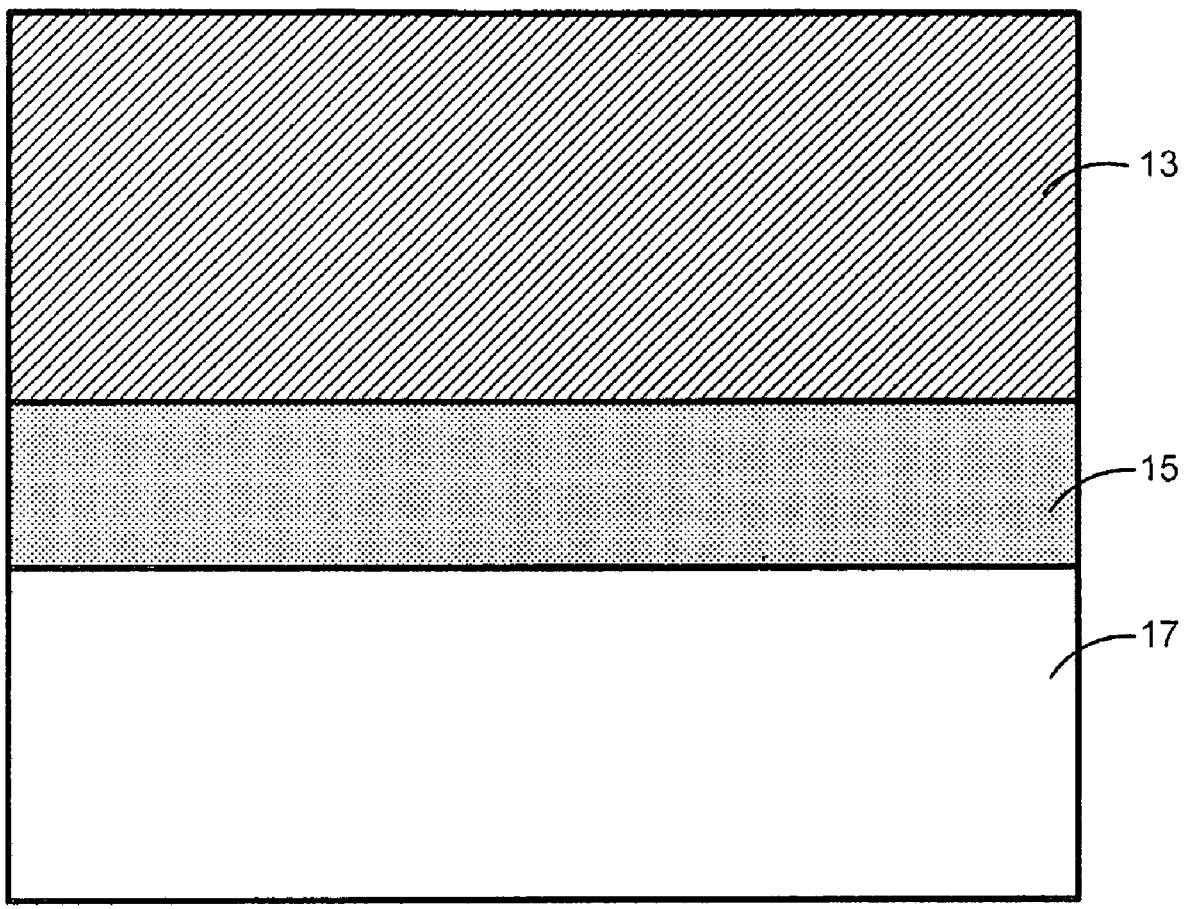
FIG. 3 is an exploded view of the metamorphic HEMT of FIG. 2, illustrating a nucleation layer between a substrate wafer and a ternary metamorphic buffer layer, according to one embodiment of the invention.

FIG. 3 is an exploded view of the mHEMT of FIG. 2, illustrating the nucleation layer 15 used to transition between the substrate 17 and the metamorphic buffer 13. The nucleation layer 15, shown in FIG. 3, can have the same composition as the substrate 17 so as to provide a smooth platform for application of the ternary metamorphic buffer 13. Hence, if the substrate 17 is GaSb, the nucleation layer 15 is also GaSb with a thickness of about 1 µm, but preferably, 50 nm or less.

Figure 4:
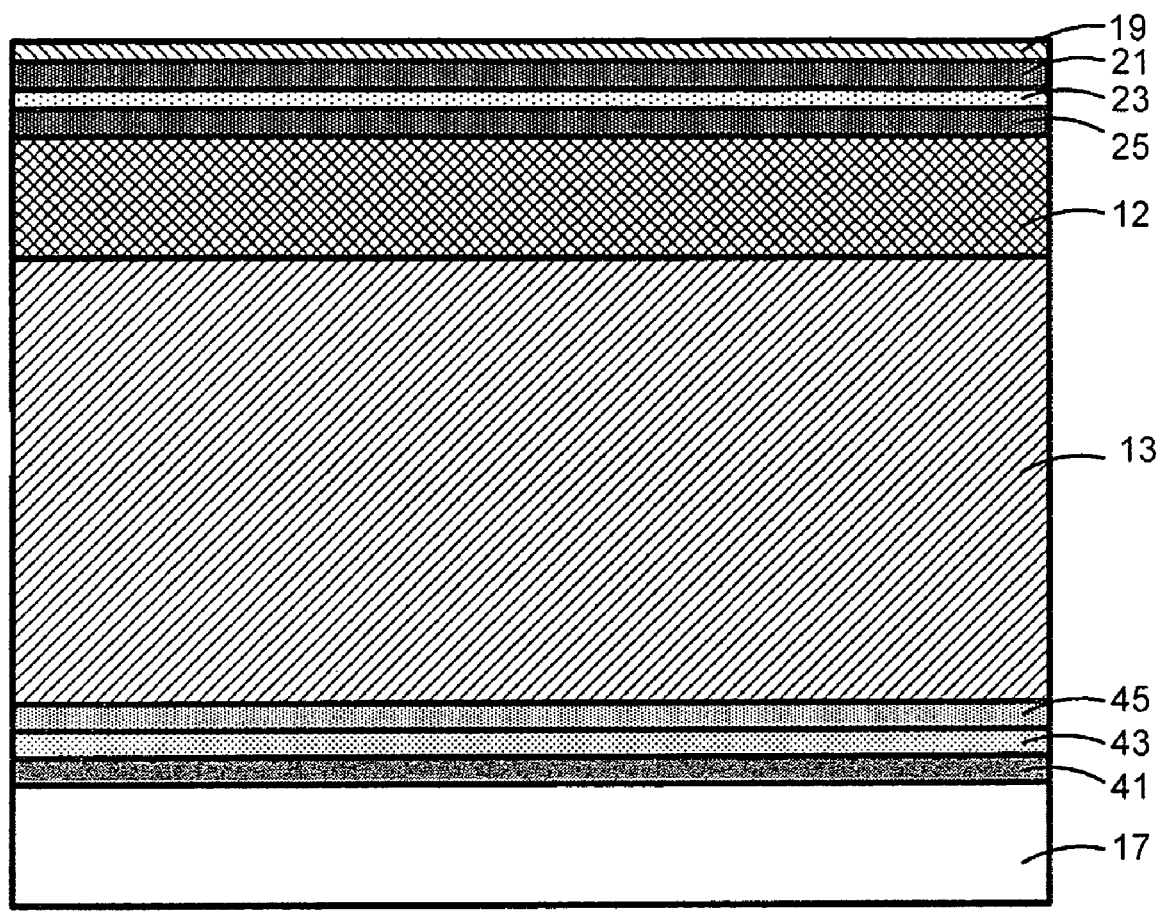
FIG. 4 is cross-sectional view of a metamorphic HEMT illustrating a plurality of nucleation layers and a plurality of ternary metamorphic buffer layers, according to one embodiment of the invention.

In one embodiment of the invention, three nucleation layers 15 can be used to transition between the ternary metamorphic buffer 13 and the substrate 17. FIG. 4 is cross-sectional view of a metamorphic HEMT illustrating a plurality of nucleation layers 41, 43 and 45, according to one embodiment of the invention. If the substrate 17 is GaAs, then the first nucleation layer 41 grown on top of the substrate 17 to smoothen the surface can be GaAs, the second nucleation layer 43 grown on top of the first transition layer 41 can be Aluminum Arsenide (AlAs), and the final nucleation layer 45 grown on top of the second transition layer 43 can be AlSb. The thickness of the GaAs first nucleation layer 41 is preferably about 50 nm or less, the AlAs second nucleation layer 43 is preferably about 10 nm or less, the AlSb third nucleation layer 45 is preferably about 30 nm or less. Those skilled in the art will appreciate that more nucleation layers can be used without departing from the scope and spirit of the invention.

Pure AlSb can be used as a final nucleation layer 45 because, unlike other semiconductors, will recover planar growth conditions quickly after the transition in lattice constant. The AlSb nucleation layer 45 can have a thickness of about 1 µm. However, for the purpose of re-planarizing the MBE growth, the AlSb nucleation layer 45 can have a thickness of about 30 nm or less. This layer structure offers much improved chemical stability when the semiconductor layers are etched through, as in back-side vias.

As shown in FIG. 4, the ternary metamorphic buffer layer 13 and the stabilizing layer 12 are grown on the nucleation layers 41, 43, and 45. This allows the selection of two layers with different compositions having desirable characteristics. For example, the ternary metamorphic buffer layer 13 can have a composition of $Al_{0.8}Ga_{0.2}Sb$ with thickness of about 1 µm, while the stabilizing layer 12 can have a composition of $Al_{0.7}Ga_{0.3}Sb$ with a thickness of about 0.3 µm. Since the stabilizing layer 12 has a higher gallium composition than the ternary metamorphic buffer layer 13, the stabilizing layer 12 is more stable when exposed to chemicals but also more conductive. To increase the resistivity of the metamorphic buffer layer, a lower gallium composition is used for the ternary metamorphic buffer layer 13.

While certain exemplary embodiments have been described and shown in the accompanying drawings, it is to be understood that such embodiments are merely illustrative of and not restrictive on the broad invention, and that this invention not be limited to the specific constructions and arrangements shown and described, since various other changes, combinations, omissions, modifications and substitutions, in addition to those set forth in the above paragraphs, are possible. Those skilled in the art will appreciate that various adaptations and modifications of the just described preferred embodiment can be configured without departing from the scope and spirit of the invention. Therefore, it is to be understood that, within the scope of the appended claims, the invention may be practiced other than as specifically described herein.

What is claimed is:

1. A metamorphic high electron mobility transistor, comprising:
    a plurality of high electron mobility transistor layers;
    a semi-insulating substrate;
    a ternary metamorphic buffer layer positioned between the semi-insulating substrate and the plurality of high electron mobility transistor layers, the ternary metamorphic buffer layer being $Al_{1-x}Ga_xSb$ such that x is greater than or equal to 0.2 but less than 0.3;
    a stabilizing layer positioned between the ternary metamorphic buffer layer and the plurality of high electron mobility transistor layers, the stabilizing layer being $Al_{1-y}Ga_ySb$ such that y is greater than 0.2 but less than or equal to 0.3 and y is greater than x; and
    a nucleation layer interposed between the semi-insulating substrate and the ternary metamorphic buffer layer, the nucleation layer having
        a first nucleation layer including GaAs grown on the semi-insulating substrate,
        a second nucleation layer including AlAs grown on the first nucleation layer, and
        a third nucleation layer including AlSb grown on the second nucleation layer;
    wherein the third nucleation layer is interposed between the second nucleation layer and the ternary metamorphic buffer layer.

2. The metamorphic high electron mobility transistor of claim 1 wherein the ternary metamorphic buffer layer is $Al_{0.8}Ga_{0.2}Sb$ and the stabilizing layer is $Al_{0.7}Ga_{0.3}Sb$.

3. The metamorphic high electron mobility transistor of claim 1 wherein the semi-insulating substrate is selected from a group consisting of GaAs, InP and GaSb.

4. The metamorphic high electron mobility transistor of claim 1 wherein the plurality of high electron mobility transistor layers comprise a first and a second layer, the first layer composed of a barrier material and the second layer composed of a channel material, the barrier material is selected from a group consisting of AlSb, AlGaSb, and GaSb, and the channel material is selected from a group consisting of InGaAs and InAs.

5. The metamorphic high electron mobility transistor of claim 1 wherein the third nucleation layer has a thickness of 30 nm or less.

6. The metamorphic high electron mobility transistor of claim 5 wherein the second nucleation layer has a thickness of 10 nm or less.

7. The metamorphic high electron mobility transistor of claim 5 wherein the first nucleation layer has a thickness of 50 nm or less.

8. A metamorphic high electron mobility transistor, comprising:
    a plurality of high electron mobility transistor layers;
    a semi-insulating substrate;
    a ternary metamorphic buffer positioned between the semi-insulating substrate and the plurality of high electron mobility transistor layers, the ternary metamorphic buffer being $Al_{1-x}Ga_xSb$ such that x is greater than or equal to 0.2 but less than 0.3;
    a stabilizing layer positioned between the ternary metamorphic buffer and the plurality of high electron mobility transistor layers, the stabilizing layer being $Al_{1-y}Ga_ySb$ such that y is greater than 0.2 but less than or equal to 0.3 and y is greater than x; and
    a nucleation layer, the nucleation layer being between the semi-insulating substrate and the ternary metamorphic buffer, and the ternary metamorphic buffer being between the nucleation layer and the plurality of high electron mobility transistor layers wherein the nucleation layer includes
        a first nucleation layer on the semi-insulating substrate, the first nucleation layer having a thickness of 50 nm or less,
        a second nucleation layer on the first nucleation layer, the second nucleation layer having a thickness of 10 nm or less, and
        a third nucleation layer on the second nucleation layer, the third nucleation layer having a thickness of 30 nm or less;
    wherein the first nucleation layer and the second nucleation layer have a first element in common and the second nucleation layer and the third nucleation layer have a second element in common; and
    wherein the third nucleation layer is interposed between the second nucleation layer and the ternary metamorphic buffer and has a third element in common with the ternary metamorphic buffer.

9. The metamorphic high electron mobility transistor of claim 8 wherein the ternary metamorphic buffer is $Al_{0.8}Ga_{0.2}Sb$ and the stabilizing layer is $Al_{0.7}Ga_{0.3}Sb$.

10. The metamorphic high electron mobility transistor of claim 8 wherein the semi-insulating substrate is selected from a group consisting of GaAs, InP and GaSb.

11. The metamorphic high electron mobility transistor of claim 8 wherein the plurality of high electron mobility transistor layers comprise a first and a second layer, the first layer composed of a barrier material and the second layer composed of a channel material, the barrier material is selected from a group consisting of AlSb, AlGaSb, and GaSb, and the channel material is selected from a group consisting of InGaAs and InAs.

12. The metamorphic high electron mobility transistor of claim 8 wherein the first nucleation layer is GaAs, the second nucleation layer is AlAs, and the third nucleation layer is AlSb.

* * * * *

UNITED STATES PATENT AND TRADEMARK OFFICE
CERTIFICATE OF CORRECTION

PATENT NO.        : 7,518,165 B2                                    Page 1 of 1
APPLICATION NO.   : 11/521012
DATED             : April 14, 2009
INVENTOR(S)       : Joshua I. Bergman et al.

It is certified that error appears in the above-identified patent and that said Letters Patent is hereby corrected as shown below:

In the Specification
    Column 1, line 4 before paragraph 1 insert the following:

--This invention was made with Government support under contract N66001-01-C-8032 awarded by the Department of Defense, DARPA, US Navy, Space & Naval Warfare Systems (SPAWAR). The Government has certain rights in the invention.--

Signed and Sealed this
Twelfth Day of July, 2016

Michelle K. Lee
*Director of the United States Patent and Trademark Office*